(12) United States Patent
Paik et al.

(10) Patent No.: US 8,264,579 B2
(45) Date of Patent: *Sep. 11, 2012

(54) SHARED-PIXEL-TYPE IMAGE SENSORS FOR CONTROLLING CAPACITANCE OF FLOATING DIFFUSION REGION

(75) Inventors: Kee-Hyun Paik, Seongnam-si (KR); Seok-ha Lee, Seoul (KR); Kang-bok Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1115 days.

This patent is subject to a terminal disclaimer.

(21) Appl. No.: 11/652,602

(22) Filed: Jan. 12, 2007

(65) Prior Publication Data

US 2007/0164332 A1    Jul. 19, 2007

(30) Foreign Application Priority Data

Jan. 13, 2006   (KR) .................. 10-2006-0004116

(51) Int. Cl.
*H04N 3/14* (2006.01)
*H01L 27/00* (2006.01)

(52) U.S. Cl. ..................................... 348/308; 250/208.1
(58) Field of Classification Search .................... None
See application file for complete search history.

(56) References Cited

U.S. PATENT DOCUMENTS

| | | | |
|---|---|---|---|
| 6,320,474 B1 * | 11/2001 | Kamiya et al. | 331/177 V |
| 6,352,869 B1 * | 3/2002 | Guidash | 438/16 |
| 6,657,665 B1 | 12/2003 | Guidash | |
| 6,809,309 B2 | 10/2004 | Kwon | |
| 7,075,049 B2 | 7/2006 | Rhodes et al. | |
| 7,087,883 B2 * | 8/2006 | He et al. | 250/214 R |
| 7,193,258 B2 | 3/2007 | Hara et al. | |
| 7,227,208 B2 * | 6/2007 | Ogura et al. | 257/292 |
| 7,525,077 B2 * | 4/2009 | Kim et al. | 250/208.1 |
| 7,561,198 B2 | 7/2009 | Sekine | |
| 7,989,750 B2 * | 8/2011 | Lee et al. | 250/208.1 |
| 2004/0251394 A1 | 12/2004 | Rhodes et al. | |
| 2005/0128327 A1 * | 6/2005 | Bencuya et al. | 348/308 |
| 2005/0168604 A1 | 8/2005 | Mishina et al. | |
| 2005/0280729 A1 | 12/2005 | Sekine | |
| 2006/0208163 A1 * | 9/2006 | Manabe et al. | 250/208.1 |
| 2006/0256221 A1 * | 11/2006 | Mckee et al. | 348/308 |
| 2007/0034939 A1 * | 2/2007 | Lee et al. | 257/316 |

FOREIGN PATENT DOCUMENTS

| | | |
|---|---|---|
| JP | 2005-268537 | 9/2005 |
| JP | 2006-005711 A | 1/2006 |
| KR | 10-1996-0011478 | 8/1996 |

(Continued)

*Primary Examiner* — Luong T Nguyen
(74) *Attorney, Agent, or Firm* — Lee & Morse, P.C.

(57) ABSTRACT

A shared-pixel-type image sensor includes a semiconductor substrate, four photoelectric conversion elements disposed adjacent to one another in one direction on the semiconductor substrate, two first transmission elements transmitting charges accumulated in two adjacent ones of the photoelectric conversion elements to a first floating diffusion region, respectively, two second transmission elements transmitting charges accumulated in the other two adjacent photoelectric conversion elements to a second floating diffusion region electrically coupled with the first floating diffusion region, respectively, MOS capacitors that are electrically coupled with the first or second floating diffusion region, a reset element resetting the charges of the first and second floating diffusion regions to a reference value, and a drive element and an select element outputting the charges of the first or second floating diffusion region.

12 Claims, 10 Drawing Sheets

FOREIGN PATENT DOCUMENTS

| | | |
|---|---|---|
| KR | 10-2000-0052598 A | 8/2000 |
| KR | 10-2003-0008481 | 1/2003 |
| KR | 10-2005-0104083 | 11/2005 |
| KR | 10-2006-0000321 A | 1/2006 |
| TW | 2005-27660 A | 8/2005 |
| WO | WO 2004/112376 A1 | 12/2004 |

\* cited by examiner

SHARED-PIXEL-TYPE IMAGE SENSORS FOR CONTROLLING CAPACITANCE OF FLOATING DIFFUSION REGION

BACKGROUND OF THE INVENTION

1. Field of the Invention

The present invention relates to image sensors. More particularly, the invention relates to shared-pixel-type image sensors for controlling the capacitance of a floating diffusion region.

2. Description of the Related Art

An image sensor converts optical images into electronic signals. With advancements made in computers and communication devices, demand for image sensors having improved performance characteristics has increased in various fields, e.g. digital cameras, camcorders, personal communication systems (PCSs), game machines, security cameras, medical micro cameras, robots, or the like.

A MOS image sensor may have a simple driving method and may be implemented by various scanning methods. In MOS image sensors, a signal processing circuit may be integrated in one chip, and thus a size of a product including such a MOS image sensor can be reduced. Further, MOS image sensors are generally compatible with MOS process technology, and thus the manufacturing cost can be reduced. Furthermore, because a MOS image sensor may consume a relatively low amount of power, MOS image sensors may be easily employed in products requiring a restricted battery capacity. MOS image sensors may also operate at relatively high resolutions. Accordingly, MOS image sensors are being used in various technologies.

However, as pixel integration is increasing in order to achieve increased resolution, areas occupied by photoelectric conversion elements are being reduced. Such products having photoelectric conversion elements occupying smaller areas may have lower sensitivity and a saturation signal amount.

Accordingly, an active pixel sensor array with a plurality of photoelectric conversion elements sharing a reading element has been proposed. By sharing a reading element, an area of the photoelectric conversion element serving as a light receiving unit is increased so as to increase light receiving efficiency.

Meanwhile, when a fill factor is increased by increasing an area of a photoelectric conversion element serving as a light receiving unit, an area of a floating diffusion region is reduced. If the relative area of the floating diffusion region is decreased, capacitance of the diffusion region is decreased.

To improve sensitivity, it should be possible to quickly accumulate a large amount of charge in the floating diffusion region in order to improve the sensitivity. Also, capacitance of the floating diffusion region should be increased in order to accumulate the large amount of charge in the floating diffusion region.

Meanwhile, an increase in capacitance of the floating diffusion region may cause a dynamic range to be reduced. Therefore, in order to satisfy such characteristics, structures for sensors enabling capacitance of the diffusion region to be appropriately controlled are desired.

SUMMARY OF THE INVENTION

The present invention is therefore directed to shared-pixel-type image sensors, which substantially overcome one or more of the problems due to the limitations and disadvantages of the related art.

It is therefore a feature of an embodiment of the present invention to provide shared-pixel-type image sensors for controlling a capacitance of a floating diffusion region.

It is therefore a separate feature of an embodiment of a shared-pixel-type image sensor employing one or more aspects of the invention to enable a total amount of a charge that can be stored in the floating diffusion region to be controlled.

It is therefore a separate feature of an embodiment of a shared-pixel-type image sensor employing one or more aspects of the invention to effectively increase a fill factor by increasing the area of the photoelectric conversion element as much as possible and adopting a layout capable of using most of the increased area as the light receiving region.

At least one of the above and other features and advantages of the present invention may be realized by providing a shared-pixel-type image sensor, including a semiconductor substrate, four photoelectric conversion elements disposed adjacent to one another in one direction on the semiconductor substrate, two first transmission elements transmitting charges accumulated in two adjacent ones of the photoelectric conversion elements to a first floating diffusion region, respectively, two second transmission elements transmitting charges accumulated in the other two adjacent photoelectric conversion elements to a second floating diffusion region electrically coupled with the first floating diffusion region, respectively, MOS capacitors that are electrically coupled with the first or second floating diffusion region, a reset element resetting the charges of the first and second floating diffusion regions to a reference value, and a drive element and a select element outputting the charges of the first or second floating diffusion region.

The MOS capacitor may store a portion of the charges that are transported from the four photoelectric conversion elements to the first and second floating diffusion regions.

At least one of the above and other features and advantages of the present invention may be separately realized by providing a shared-pixel-type image sensor, including first and second floating diffusion regions in a semiconductor substrate, a MOS capacitor having a first electrode corresponding to a substrate region on a side of one of the first floating diffusion region and the second floating diffusion region, a gate insulating film formed on the first electrode and a second electrode corresponding to a gate electrode formed on the gate insulating film, and metallic wiring lines electrically coupling the first and second floating diffusion regions and the MOS capacitor.

The sensor may include a drive element that is formed on the semiconductor substrate, wherein the drive element may be electrically coupled with the metallic wiring lines. The drive element may have a drive gate insulating film and a drive gate, and the drive gate insulating film and the drive gate may be on a same level as the gate insulating film and the gate electrode of the MOS capacitor, respectively.

At least one of the above and other features and advantages of the present invention may be separately realized by providing a shared-pixel-type image sensor, including a semiconductor substrate that has first and second one-axis-merged dual lobe actives, and first and second independent reading element actives allocated to the first and second one-axis-merged dual lobe actives, respectively, a plurality of transmission gates between dual lobe actives of the first and second one-axis-merged dual lobe actives and connection actives, respectively, a first reading gate on an axis active of the first one-axis-merged dual lobe active, a dummy gate on an axis active of the second one-axis-merged dual lobe active, and second and third reading gates on the first and second independent reading element actives.

The first reading gate may be a reset gate. The second and third reading gates may be a selection gate and a drive gate, respectively. The connection actives of the first and second one-axis-merged dual lobe actives may be two-dimensionally separated and electrically coupled. The connection actives of the first and second one-axis-merged dual lobe actives and the dummy gate may be electrically coupled with each other by an interconnection layer. The second reading gate formed on the first independent reading element active may be electrically coupled with the interconnection layer. The dual lobe actives of the first and second one-axis-merged dual lobe actives may be formed so as to be adjacent to each other in one direction.

The dummy gate may be substantially aligned with the first reading gate. The dummy gate may extend to cover substantially an entire surface of the axis active of the second one-axis-merged dual lobe active.

At least one of the above and other features and advantages of the present invention may be separately realized by providing a shared-pixel-type image sensor including a semiconductor substrate that has first and second one-axis-merged dual lobe actives, a plurality of transmission gates between dual lobe actives of the first and second one-axis-merged dual lobe actives and connection actives, respectively, a plurality of reading gates on an axis active of the first one-axis-merged dual lobe active, and a dummy gate group that has at least one dummy gate on an axis active of the second one-axis-merged dual lobe active.

The plurality of reading gates may include at least one of a reset gate, a drive gate and a selection gate. The connection actives of the first and second one-axis-merged dual lobe actives may be two-dimensionally separated and electrically coupled. The connection actives of the first and second one-axis-merged dual lobe actives and the dummy gate group may be electrically coupled with each other by an interconnection layer. A second one of the plurality of reading gates formed on the first independent reading element active may be electrically coupled with the interconnection layer. The dual lobe actives of the first and second one-axis-merged dual lobe actives may be adjacent to each other in one direction.

The dummy gate group may include at least one dummy gate that is substantially aligned with at least one reading gate among the plurality of reading gates. The dummy gate group may include one dummy gate, and the dummy gate may extend to cover substantially an entire surface of the axis active of the second one-axis-merged dual lobe active.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
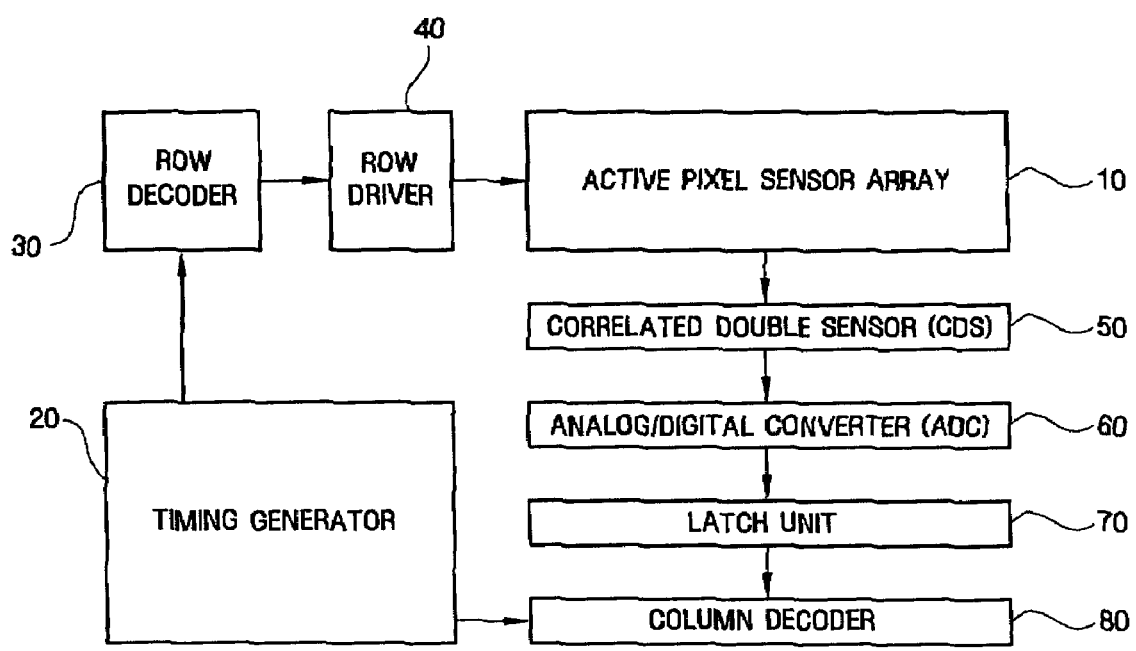
FIG. 1 illustrates a block diagram of an exemplary image sensor employing one or more aspects of the present invention.

Korean Patent Application No. 10-2006-0004116 filed on Jan. 13, 2006 in the Korean Intellectual Property Office, and entitled: "Shared Pixel-Type Image Sensor for Controlling Capacitance of floating Diffusion Region," is incorporated by reference herein in its entirety.

Advantages and features of the present invention and methods of accomplishing the same may be understood more readily by reference to the following detailed description of exemplary embodiments and the accompanying drawings. The invention may, however, be embodied in many different forms and should not be construed as being limited to the embodiments set forth herein. Rather, these embodiments are provided so that this disclosure will be thorough and complete and will fully convey the concept of the present invention to those skilled in the art, and the present invention will only be defined by the appended claims. Accordingly, processes, element structures, and technologies known in some embodiments are not specifically described to avoid ambiguous definition of the present invention.

Like reference numerals refer to like elements throughout the specification. In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

Terms used in the present specification are used to describe embodiments, and do not limit the present invention. Terms 'comprise' and/or 'comprising' used in the present specification are used so as not to exclude that described components, processes, operations, and/or elements are present in or added to one or more another components, processes, operations, and/or elements. A term 'and/or' is used to mean that each of described items and one or more combinations of the items are included.

In the exemplary embodiments of the present invention, a CMOS image sensor will be exemplified as an example of an image sensor. However, the present invention is not limited to thereto, and includes, e.g., all image sensors formed by using only an NMOS or PMOS process or both a NMOS process and a PMOS.

In the exemplary embodiments of the present invention, a four-transistor image sensor will be exemplified as an example of an image sensor. However, the present invention is not limited thereto, and includes, e.g., a three-transistor image sensor and a five-transistor image sensor.

Further, in the exemplary embodiments of the present invention, a 4-shared-pixel-type image sensor will be exemplified as an example of a shared-pixel-type image sensor. However, the present invention is not limited thereto, and includes, e.g., all shared-pixel-type image sensors in which shared pixels, each of which may have a plurality of photoelectric conversion elements, are repeatedly arrayed.

FIG. 1 illustrates a block diagram of an exemplary image sensor employing one or more aspects of the present invention.

Referring to FIG. 1, an image sensor may include an active pixel sensor (APS) array 10, a timing generator 20, a row decoder 30, a row driver 40, a correlated double sampler (CDS) 50, an analog to digital converter (ACD) 60, a latch 70, and a column decoder 80.

The APS array 10 may include a plurality of pixels that are two-dimensionally arranged. Each of the pixels in the APS array 10 may include one or more photoelectric conversion elements.

For example, in some embodiments of the present invention, the APS array 10 may have a structure in which a plurality of 4-shared pixels are arranged in a matrix. Each of the 4-shared pixels may include four photoelectric conversion elements sharing reading elements and each of the 4-shared pixels may be used as a unit. When, e.g., the 4-shared pixels are used, areas of the reading elements may be reduced, and thus sizes of the photoelectric conversion elements may be increased. Embodiments of the invention may enable light receiving efficiency to be improved, and thus sensitivity and a saturated signal ratio to be improved.

Each of the pixels, e.g., each of the 4-shared pixels, may convert a photoelectric image into an electric signal. During operation, the APS array 10 may receive a pixel selection signal (SEL), a reset signal (RX), a charge transmission signal (TX), or the like from the row driver 40. The converted signal(s) of one or more of the 4-shared pixels included in the APS array 10 may be supplied by the APS array 10 to the correlated double sampler 50 through a vertical signal line.

The timing generator 20 may supply a timing signal and a control signal to the row decoder 30 and the column decoder 80, respectively.

The row driver 40 may supply to the APS array 10 a plurality of driving signals for driving the plurality of unit pixels, e.g., plurality of 4-shared pixels P, according to the result decoded by the row decoder 30. Generally, when the plurality of unit pixels are arranged in a matrix, the row driver 40 may supply the driving signal(s) to every row of the APS array 10 one-by-one.

The correlated double sampler 50 may receive the electric signal(s) generated in the APS array 10 through the vertical signal line, and may hold and sample the electric signal(s). More particularly, e.g., a specific noise level and a signal level of the electric signal(s) may be sampled twice, and a difference level between the specific noise level and the signal level of the electric signal may be outputted by the correlated double sampler 50.

The analog to digital converter 60 may receive the difference level from the correlated double sampler 50, and may convert an analog signal corresponding to the difference level into a digital signal. The analog to digital converter 60 may output the digital signal to the latch unit 70.

The latch unit 70 may latch the digital signal from the analog to digital converter 60. The latched signals may be sequentially output to an image signal processing unit (not shown) according to a result decoded by the column decoder 80.

Figure 2:
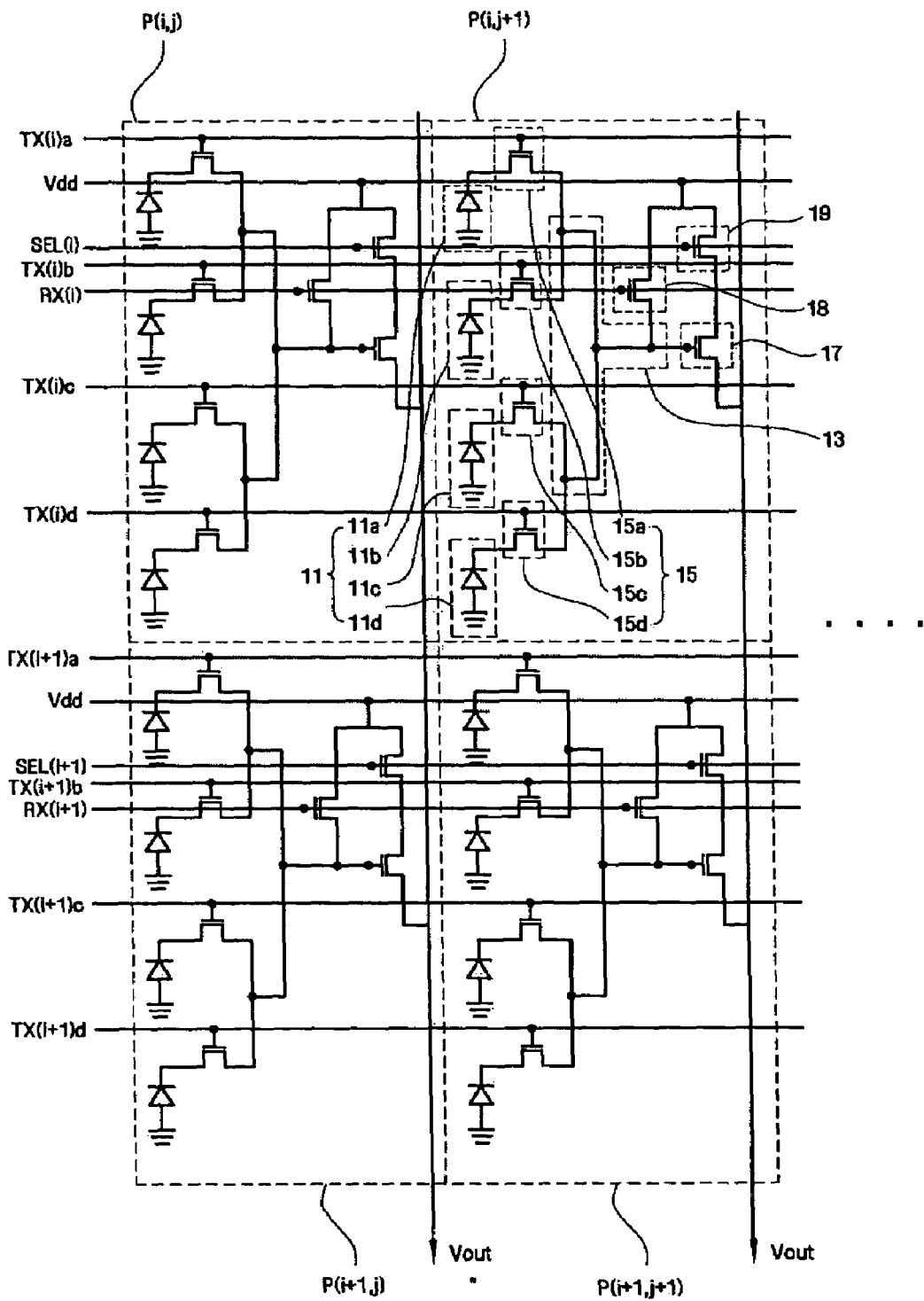
FIG. 2 illustrates a circuit diagram of an exemplary image sensor employing one or more aspects of the present invention.

FIG. 2 illustrates a circuit diagram of an exemplary image sensor employing one or more aspects of the present invention.

Referring to FIGS. 1 and 2, the 4-shared pixels P, e.g., including P(i,j), P(i,j+1), P(i+1,j), P(i+1,j+1), may be arranged in a matrix to construct the APS array 10. In each of the 4-shared pixels P, the four photoelectric conversion elements may share the reading elements. The reading elements described in the present specification may, e.g., read photo signals incident on the photoelectric conversion elements, and may include, e.g., a select element, a drive element, and/or a reset element.

More particularly, each of the 4-shared pixels P may include four photoelectric conversion elements 11a, 11b, 11c, and 11d. Each of the photoelectric conversion elements may absorb incident light and may accumulate a charge corresponding to the light quantity. In the exemplary embodiment illustrated in FIG. 2, photo diodes are illustrated as the photoelectric conversion elements 11a, 11b, 11c, and 11d. However, embodiments of the invention are not limited to photoelectric conversion elements. For example, the photoelectric conversion elements 11a, 11b, 11c, and 11d may be, e.g., photo diodes, photo transistors, photo gates, pined photo diodes or combinations thereof.

The photoelectric conversion elements 11a, 11b, 11c, and 11d may be respectively coupled with respective ones of charge transporting elements 15a, 15b, 15c, and 15d. The charge transporting elements 15a, 15b, 15c and 15d may transport the accumulated charges to a floating diffusion region 13. The floating diffusion region (FD) 13 may correspond to a region that converts the transported charge into a voltage. The floating diffusion region (FD) 13 may not have parasitic capacitance. Therefore, the charges may be accumulated and stored in the floating diffusion region (FD) 13.

Image sensors employing one or more aspects of the invention enable a charge amount that may be accumulated in the floating diffusion region (FD) 13 to be controlled by controlling a capacitance of the floating diffusion region (FD) 13.

For example, in order to increase the capacitance of the floating diffusion region 13, a MOS capacitor (described below) may be connected in parallel to the floating diffusion region (FD) 13, and the parasitic capacitance of the floating diffusion region (FD) 13 may be increased. As a result, the total capacitance of the floating diffusion region 13 may be controlled. Such aspects and advantages of the present invention will be additionally described below.

In each of the 4-shared pixels P, the four photoelectric conversion elements 11a, 11b, 11c, and 11d may share the drive element 17, the reset element 18, and the select element 19, which may serve as the reading elements. For description purposes, the functions of these elements will be described using an i-row pixels P(i, j), P(i, j+1), etc, as an example.

The drive element 17 may be, e.g., a driving amplifier that amplifies a variation in an electric potential of the floating diffusion region 13 that is supplied with the charge accumulated in the respective photoelectric conversion elements 11a, 11b, 11c, and 11d. The drive element 17 may output the amplified signal to an output line Vout.

The reset element 18 may periodically reset the floating diffusion region 13. The reset element 18 may include, e.g., a MOS transistor. The MOS transistor may be driven by a bias supplied by a reset line RX(i) for applying a predetermined bias. When a reset element 18 is turned on by the bias supplied by the reset line RX(i), a predetermined electric potential, e.g., a power supply voltage VDD, supplied to a drain of the reset element 18 may be supplied to the floating diffusion region 13.

A select element 19 may select respective ones of the 4-shared pixels P in a row unit, e.g., i-th row, which are to be read out. The select element 19 may include a MOS transistor that is driven by a bias supplied by a row selection line (SEL(i)). If the select element 19 is turned on by the bias supplied by the row selection line (SEL(i)), the predetermined electric potential supplied to the drain of the select element 19, e.g., the power supply voltage VDD, may be supplied to a drain of the drive element 17.

Transmission lines (TX(i)a, TX(i)b, TX(i)c, and TX(i)d) for applying a bias to the charge transmission elements 15a, 15b, 15c, and 15d, the reset line (RX(i)) for applying the bias to the reset line 18, and the row selection line (SEL(i)) for applying the bias to the select element 19 may be arranged so as to extend parallel to one another.

Figure 3:
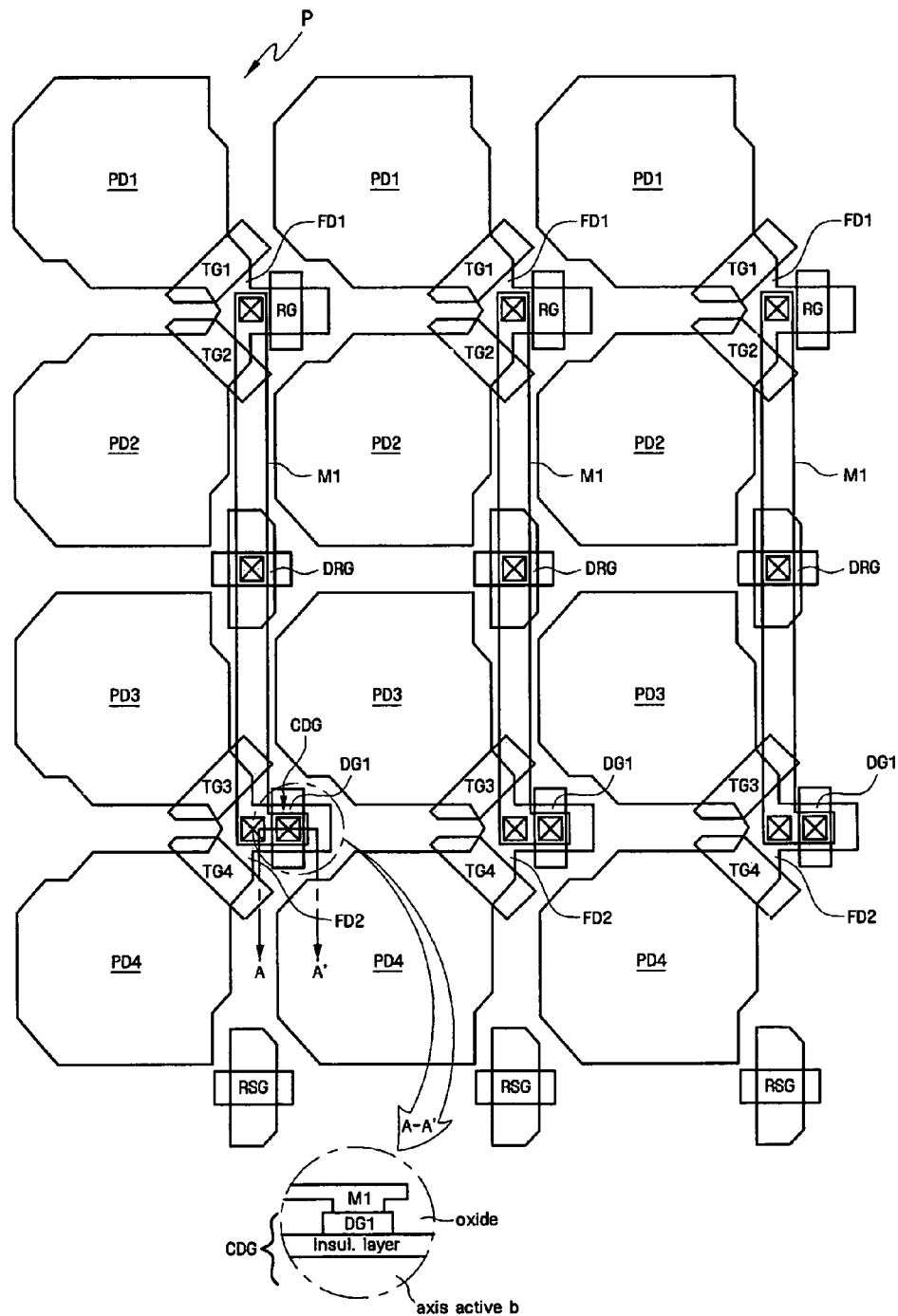
FIG. 3 illustrates a layout diagram of a first exemplary embodiment of an APS array of an image sensor employing one or more aspects of the present invention.
Figure 4:
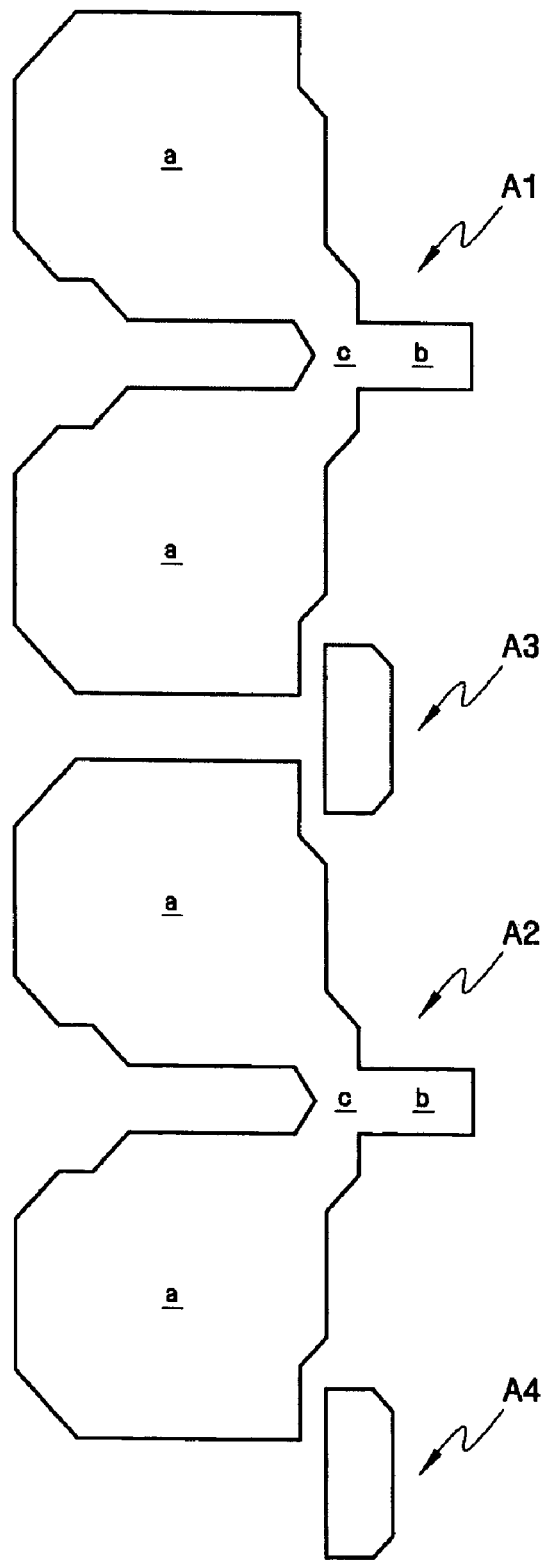
FIG. 4 illustrates a layout diagram of an exemplary unit active of a shared pixel of the exemplary image sensor illustrated in FIG. 3.

FIG. 3 illustrates a layout diagram of a first exemplary embodiment of an APS array of an image sensor employing one or more aspects of the invention. FIG. 4 illustrates a layout diagram of only an exemplary unit active of a shared pixel of the exemplary image sensor illustrated in FIG. 3.

Referring to FIGS. 3 and 4, the APS array of the image sensor according to the first embodiment of the present invention may have the following characteristics. A first active A1 and a second active A2 may be repeatedly arranged. More particularly, pairs of one of the first actives A1 and one of the second active A2 may be repeatedly arranged. Each of the first actives A1 may correspond to a region where two photoelectric conversion elements PD1 and PD2 sharing a first floating diffusion region FD1 may be disposed. Each of the second actives A2 may correspond to a region where two other photoelectric conversion elements PD3 and PD4 sharing a second floating diffusion region FD2 may be disposed.

Third and fourth actives A3 and A4, which may serve as two independent reading element actives, may be allocated to each pair of first and second actives A1 and A2. That is, in some embodiments of the invention, the first to fourth actives A1, A2, A3, and A4 may form a unit active of one of the 4-shared pixels P.

Referring to FIGS. 3 and 4, in some embodiments of the invention, each of the first and second actives A1 and A2 correspond to a one-axis-merged dual lobe-typed active. More particularly, e.g., in the first active A1 and the second active A2, a dual lobe active a may be merged with one axis active b by a connection active c. The dual lobe active a may be opposite to the axis active b in one direction, e.g., a column direction. Therefore, in some embodiments of the invention, e.g., an outer appearance of the one-axis-merged dual lobe-type active may be similar to an outer appearance of hypocotyls of dual cotyledon plants and dual cotyledons branched from the hypocotyls.

The dual lobe active a of the first active A1 may correspond to a dual photoelectric conversion element active where two photoelectric conversion elements PD1 and PD2 may be disposed, and the connection active c of the first active A1 may correspond to a first floating diffusion region active FD1. Further, the dual lobe active a of the second active A2 may correspond to a dual photoelectric conversion element active where two photoelectric conversion elements PD3 and PD4 are disposed, and the connection active c of the second active A2 may correspond to a second floating diffusion region active FD2.

As shown in FIGS. 3 and 4, according to the first exemplary embodiment of the present invention, three reading elements, e.g., the reset element, the select element, and the drive element, may not be disposed in each of the actives corresponding to one or more of the photoelectric conversion elements, e.g., the first and second actives A1, A2. That is, e.g., in some embodiments of the invention, the reading elements may be distributed among actives, e.g., the first and second actives A1, A2, associated with one of the pixels, e.g., one of the 4-shared pixels P. More particularly, e.g., one or some of the reading elements may be disposed in the first active A1, and remaining one(s) of the reading elements may be disposed in the second active A2 and/or in other actives that do not correspond to one or more of the photoelectric conversion elements, e.g., third and fourth active A3, A4.

More particularly, as shown in FIGS. 3 and 4, in some embodiments of the invention, one of reading elements may be disposed in the axis active b of the first active A1 and the remaining two reading elements may be separately formed in the third and fourth actives A3 and A4. The third and fourth actives A3 and A4 may be separated from each other. Accordingly, as shown in FIG. 4, embodiments of the invention enable it is possible to effectively provide the actives, e.g., A1, A2, A3, A4 associated with one of the pixels, e.g., 4-shared pixel P, to be substantially uniformly arranged. That is, embodiments of the invention make it possible to prevent non-uniform arrangement of actives by separating out the reading elements on separate actives rather than concentrating the reading elements shared by the four photoelectric conversion elements PD1, PD2, PD3, and PD4 on one reading element active, as in conventional image sensors.

More particularly, if only one reading element is formed on the axis active b of the first active A1, a length of the axis active b may correspond to a sum of one source and drain junction width and a gate line width. Thus, the axis active b may extend a distance, corresponding to a sum of one source and drain junction width and a gate line width, in a direction of the dual photoelectric conversion element active a of the first active A1 of an adjacent column. As a result, the axis active b may not have a large influence on the interval between the dual photoelectric conversion element actives a. Therefore, the interval between the dual photoelectric conversion element actives a may be a minimum space required when separating potentials of the two photoelectric conversion elements PD1 and PD2, PD3 and PD4. Accordingly, the photoelectric conversion elements PD1, PD2, PD3, PD4 can be formed as large as possible, which may result in effectively increasing a fill factor.

In the first active A1, transmission gates TG1 and TG2 of two transmission elements may be respectively formed between the dual lobe active a of the one-axis-merged dual lobe-typed active of the first active A1 and the connection active c. A reset gate RG may be arranged in the axis active b of the first active A1 so as to form a reset element. To improve efficiency of wiring lines, the reading element formed on the axis active b of the first active A1 may be the reset element. Since the reset element performs a function of periodically resetting the first and second floating diffusion regions FD1 and FD2, by providing the reset element at one junction between the first and second floating regions FD1 and FD2, the wiring lines may be minimized. However, in embodiments of the invention, the reading element formed in the axis active b is not limited to the reset element.

In the second active A2, transmission gates TG3 and TG4 of two transmission elements may be respectively formed between the dual lobe active a of the one-axis-merged dual lobe-typed active a of the second active A2 and the respective connection active c. Because the second floating diffusion region FD2 may be electrically connected to the first floating diffusion region FD1 through an interconnection layer M1 (not shown), the charges transported to the second floating diffusion region FD2 may be read out through the plurality of reading elements that are formed so as to correspond to the first floating diffusion region FD1.

Further, in order to implement optical symmetry between the actives of one of the pixels, e.g., the first active A1 and the second active A2 of one of the 4-shared pixels P, in the axis active b of the second active A2, a dummy gate DG1 may be arranged in a line to the reset gate RG. In embodiments of the invention, the dummy gate DG1 arranged on the axis active b of the second active A2 may form a MOS capacitor.

The MOS capacitor may include a first electrode corresponding to a substrate region on a side adjacent to the second floating diffusion region FD2, a gate insulating film laminated on the first electrode, and a second electrode corresponding to a dummy gate DG1 formed on the gate insulating film. The gate insulating film and the dummy gate DG1 of the MOS capacitor may be respectively formed on the same layer levels as the drive gate (DRG) and the drive gate insulating film of the drive element. Thus, in such cases, the gate insulating film and the dummy gate DG1 of the MOS capacitor may be simultaneously formed when the drive gate insulating film and the drive gate DRG of the drive element are formed.

The first floating diffusion region FD1, the second floating diffusion region FD2, and the MOS capacitor may be electrically coupled with one another through the interconnection layer M1. Further, the drive element may also be electrically coupled with the first floating diffusion region FD1, the second floating diffusion region FD2, and the MOS capacitor through the interconnection layer M1.

The MOS capacitor may be electrically coupled with the first and second floating diffusion regions FD1 and FD2, and may store a portion of charges transported from the photoelectric conversion elements PD1, PD2, PD3, and PD4 to the first and second floating diffusion regions FD1 and FD2 by the transmission elements TG1, TG2, TG3, and TG4.

The charges accumulated in the photoelectric conversion elements PD1, PD2, PD3, and PD4 may be transported to the first and second floating diffusion regions FD1 and FD2 by the transmission elements TG1, TG2, TG3, and TG4. In some embodiments of the invention, a total amount of charges that may be transported to the first and second floating elements FD1 and FD2 may be proportional to a power supply voltage and a capacitance of the first and second floating diffusion regions FD1 and FD2. Accordingly, when the capacitance of the first and second floating diffusion regions FD1 and FD2 increases, a total amount of charges transported to the first and second floating diffusion regions FD1 and FD2 may also increase.

A total capacitance Ctotal of the first and second diffusion regions FD1 and FD2 may be a sum of first parasitic capacitance CFD1, second parasitic capacitance CFD2, and MOS capacitance CDG. The first parasitic capacitance CFD1 may correspond to a parasitic capacitance between the connection active c of the first active A1 where the first floating diffusion region FD1 is formed and a lower semiconductor substrate. The second parasitic capacitance CFD2 may correspond to a parasitic capacitance among the connection active c of the second active A2 where the second floating diffusion region FD2 is formed, the axis active b of the second active A2, and the lower semiconductor substrate. Meanwhile, the MOS capacitance CDG may correspond to capacitance formed between the first electrode made of a substrate region on a side adjacent to the second floating diffusion region FD2 and the second electrode of the dummy gate DG1.

Accordingly, in some embodiments of the invention, the first parasitic capacitance CFD1, the second parasitic capacitance CFD2, and the MOS capacitance CDG may be appropriately adjusted, so that the total capacitance Ctotal of the first and second floating diffusion regions FD1 and FD2 can be controlled.

More particularly, e.g., in order to increase the total capacitance Ctotal of the first and second floating diffusion regions FD1 and FD2, the second parasitic capacitance CFD2 and the MOS capacitance CDG may be increased. If the MOS capacitor may be disposed on the axis active b of the second active A2, the total capacitance Ctotal of the first and second floating diffusion regions FD1 and FD2 may be increased by the capacitance CDG of the MOS capacitor. Further, in the same manner as the first active A1, the axis active b may be disposed on the second active A2, and thus an area of the upper electrode formed by the second parasitic capacitance CFD2 may be increased. Therefore, in embodiments of the invention, the second parasitic capacitance CFD2 may also be increased.

That is, the total capacitance Ctotal of the first and second floating diffusion regions FD1 and FD2 may be controlled by adjusting the second parasitic capacitance CFD2 and the MOS capacitance CDG. Therefore, it is possible to control an amount of charge accumulated in the first and second floating diffusion regions FD1 and FD2.

In some embodiments of the invention, each of the third and fourth actives A3 and A4 may correspond to an independent reading element active. That is, one reading element may be formed in each of the third and fourth actives A3 and A4. When a reset element is formed on the axis active b of the first active A3, the drive element may be formed in the third active A3, and a selection element may be formed in the fourth active A4. Therefore, the drive gate DRG of the drive element may be disposed in the third active A3, and the selection gate RSG of the selection element may be disposed in the fourth active A4. However, according to a method of forming wiring lines, the selection element may be formed in the third active A3, and the drive element may be formed in the fourth active A4. The wiring lines may include a conductive material, e.g., metal.

In such cases, the third active A3 may be disposed in a crossing region between an inter-column space of a matrix of a pair of first and second actives A1 and A2 and an inter-row space between the first and second actives A1 and A2 such that an area of each photoelectric conversion element a may be made as large as possible.

In the same manner, the fourth active A4 may be disposed in a crossing region between an inter-column space of a matrix and an inter-row space such that an area of each photoelectric conversion element active a may be made as large as possible.

Each of the third and fourth actives A3 and A4 may be required to have at least two junction regions formed in one direction and a length in which one gate DRG or RSG formed between the two junction regions can be disposed. Thus, each of the third and fourth sides A3 and A4 may include a long side and a short side.

In the crossing region, the long sides of the third and fourth actives A3 and A4 may be oriented in one of the row direction and the column direction. As shown in FIGS. 3 and 4, in some embodiments of the invention, the long sides of the third and fourth actives A3 and A4 may be disposed in the row direction such that the area of the photoelectric conversion element active may be made to be as large as possible, e.g., maintained to the maximum.

Figure 5:
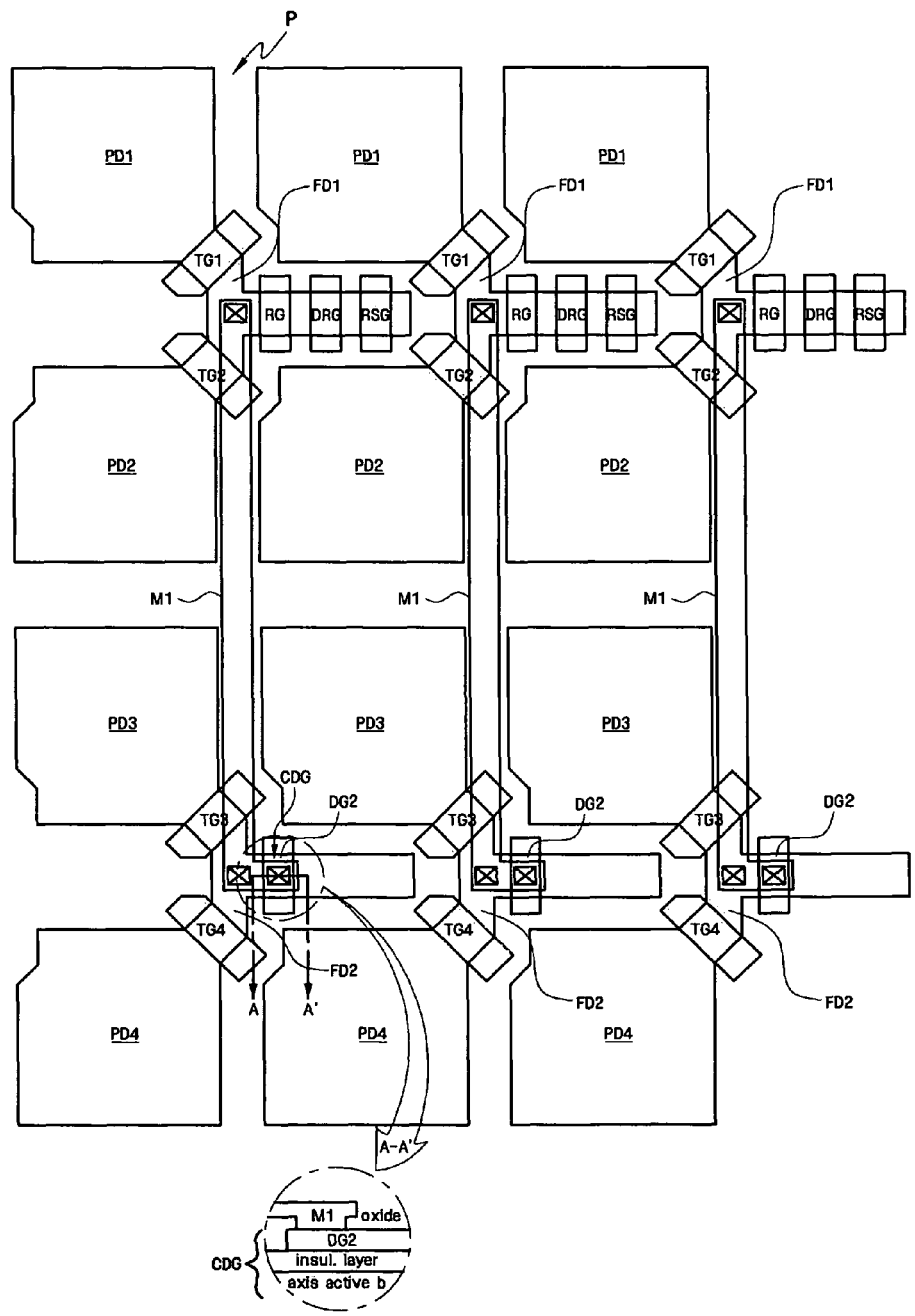
FIG. 5 illustrates a layout diagram of a second exemplary embodiment of an APS array of an image sensor employing one or more aspects of the invention.

FIG. 5 illustrates a layout diagram of a second exemplary embodiment of an APS array of an image sensor employing one or more aspects of the invention. In FIG. 5, the same constituent elements as those in FIG. 3 are denoted by the same reference numerals, and the detailed description thereof will be omitted.

Referring to FIG. 5, in each of the 4-shared pixels P, which may be a repeated unit in an APS array of an image sensor according to the second embodiment of the present invention, a dummy gate DG2 forming an upper electrode of the MOS capacitor may extend to cover an entire or substantially an entire axis active b of the second active A2.

That is, in such embodiments of the invention, the MOS capacitor may include a first electrode that may be made of a substrate region of a side adjacent to the second floating diffusion region FD2, and a second electrode that may be made of the gate insulating film laminated on the first electrode, and the dummy gate DG2. The dummy gate DG2 may be disposed on the gate insulating film and may extend to cover the entire or substantially the entire axis active b of the second active A2.

If the dummy gate DG2 of the MOS capacitor extends to cover the entire axis active b of the second active A2, a capacitance may be proportional to areas of the upper and lower electrodes. Thus, a capacitance CDG of the MOS capacitor may be increased.

Accordingly, the total capacitance Ctotal of the first and second floating diffusion regions FD1 and FD2 may be further increased, which may result in increasing a total amount of a charge stored in the first and second floating diffusion regions FD1 and FD2.

Figure 6:
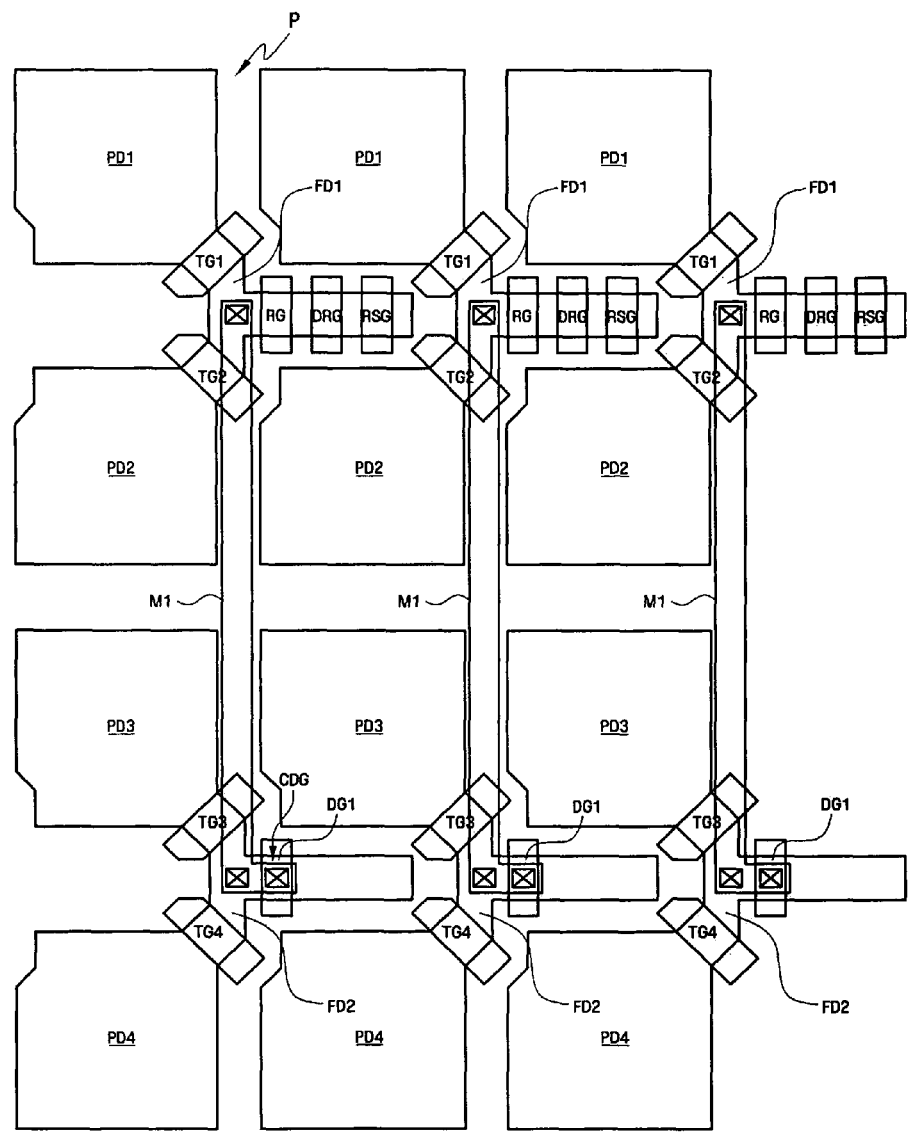
FIG. 6 illustrates a layout diagram of a third exemplary embodiment of an APS array of an image sensor employing one or more aspects of the present invention.
Figure 7:
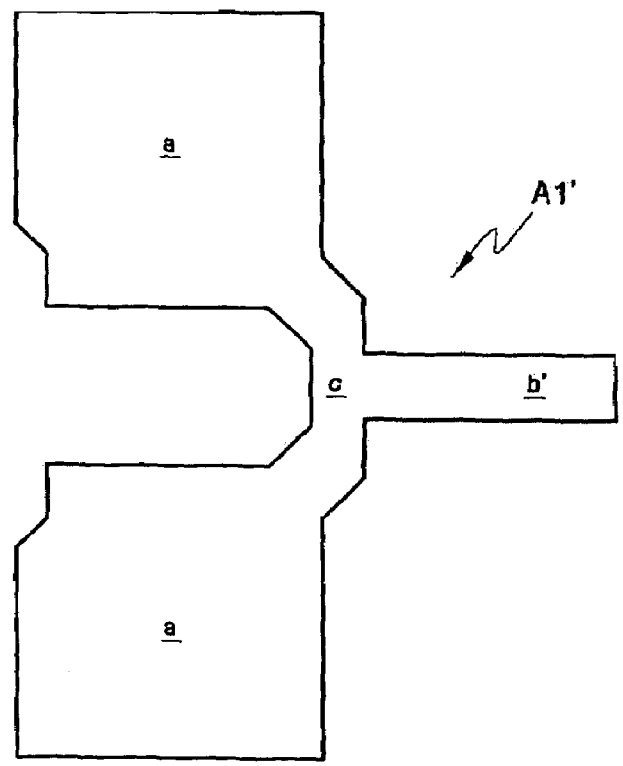
FIG. 7 illustrates a layout diagram of an exemplary unit active of a shared pixel of the exemplary image sensor illustrated in FIG. 6.
Figure 7:
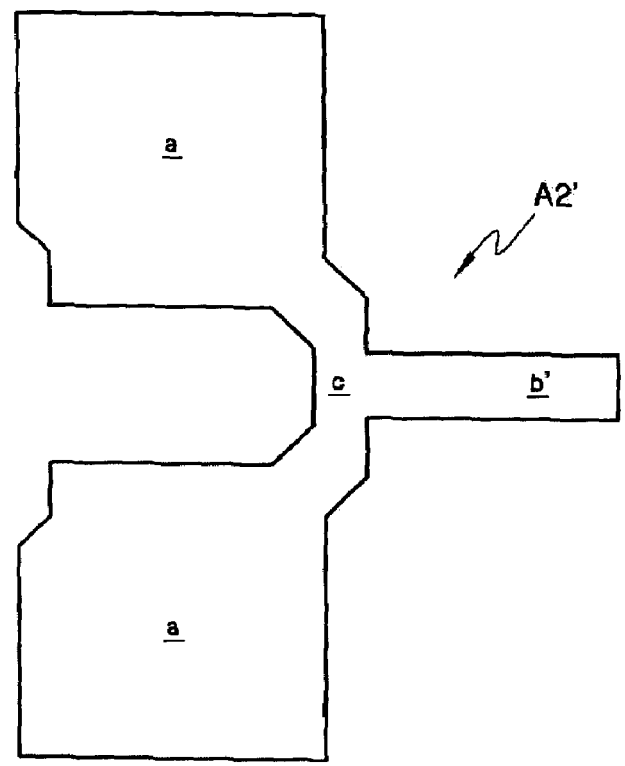

FIG. 6 illustrates a layout diagram of a third exemplary embodiment of an APS array of an image sensor employing one or more aspects of the present invention. FIG. 7 illustrates a layout diagram of an exemplary unit active of a shared pixel of the exemplary image sensor illustrated in FIG. 6. In FIGS. 6 and 7, the same constituent elements as those in FIGS. 3 and 4 are denoted by the same reference numerals, and the detailed description thereof will be omitted.

In the 4-shared pixels P that may be repeated unit in an APS array of an image sensor according to the third embodiment of the present invention, a first active A1' and a second active A2' form the unit active of the 4-shared pixel P.

In the 4-shared pixel P, two photoelectric conversion elements PD1 and PD2, the first floating diffusion region FD1, and the plurality of reading elements may be disposed in the first active A1'. The other two photoelectric conversion elements PD3 and PD4, the second floating diffusion region FD2, and the MOS capacitor may be formed in the second active A2'. Each of the first active A1' and the second active A2' may correspond to a one-axis-merged dual lobe-typed active.

That is, in each of the first active A1' and the second active A2', the dual lobe actives a may be merged with one axis active b' by a connection active c. In this case, the dual lobe active a of the first active A1 may correspond to a dual photoelectric conversion element active where the two photoelectric conversion elements PD1 and PD2 are disposed, and the connection active c may correspond to the active of the first floating diffusion region FD1. The dual lobe active a of the second active A2' may correspond to a dual photoelectric conversion element active where the two photoelectric conversion elements PD3 and PD4 are formed, and the connection active c may correspond to the active of the second floating diffusion region FD2.

Accordingly, in the first active A1', the transmission gates TG1 and TG2 of the two transmission elements may be respectively formed between the dual lobe active a of the one-axis-merged dual lobe active of the first active A1 and the connection active c, and the plurality of reading gates RG, DRG, and RSG may be formed on the axis active b' connected to the connection active c.

Further, in the second active A2', the transmission gates TG3 and TG4 of the two transmission elements may be respectively formed between the dual lobe active a of the one-axis-merged dual lobe active of the second active A2' and the connection active c. Since the second floating diffusion region FD2 may be electrically connected to the first floating diffusion region FD1 through the interconnection layer M1, the charges transported to the second floating diffusion region FD2 may be read out through the plurality of reading elements that are formed so as to correspond to the first floating diffusion region FD1.

To accommodate for the plurality of reading gates RG, DRG, and RSG on the axis active b', the axis active b' of the second exemplary embodiment may extend further away from the connection active c than the axis active b of the first exemplary embodiment illustrated in FIGS. 3 and 4.

Further, in some embodiments of the invention, in the axis active b' of the second active A2', the dummy gate DG2 may be arranged. The dummy gate DG2 may form a MOS capacitor.

Because the MOS capacitor may be electrically connected to the first and second floating diffusion regions FD1 and FD2 by the interconnection layer M1, the charges transported to the first and second floating diffusion regions may be divided and stored in the MOS capacitors.

The total capacitance Ctotal of the first and second floating diffusion regions FD1 and FD2 may correspond to a sum of the first parasitic capacitance DFD1, the second parasitic capacitance CFD2, and the MOS capacitor CDG. Accordingly, the total capacitance Ctotal of the first and second floating diffusion regions FD1 and FD2 may be controlled by adjusting the second parasitic capacitance CFD2 and the MOS capacitance CDG. Accordingly, embodiments of the invention may enable amount of charge accumulated in the first and second floating diffusion regions FD1 and FD2 to be controlled.

Figure 8:
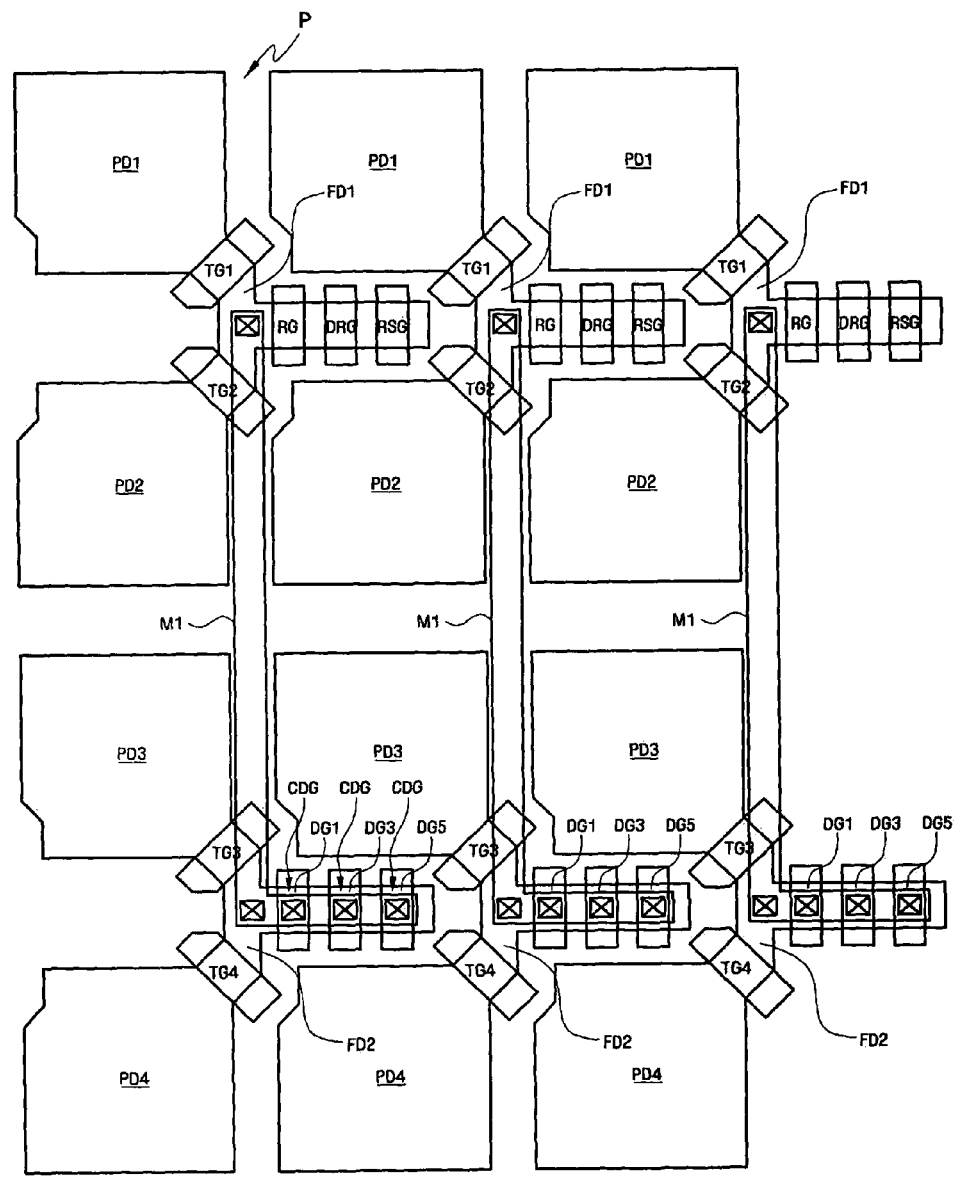
FIG. 8 illustrates a layout diagram of a fourth exemplary embodiment of an APS array of an image sensor employing one or more aspects of the present invention.

FIG. 8 illustrates a layout diagram of a fourth exemplary embodiment of an APS array of an image sensor employing one or more aspects of the present invention. In FIG. 8, the same reference numerals as those in FIG. 6 are denoted by the same reference numerals, and the description thereof will be omitted.

Referring to FIG. 8, the 4-shared pixel P that may be a repeated unit in an APS array of an image sensor according to the fourth embodiment of the present invention may include a dummy gate group including a plurality of dummy gates DG1, DG3, and DG5. More particularly, as shown in FIG. 8, the plurality of dummy gates DG1, DG3, and DG5 of the dummy gate group may be substantially aligned with the reading gates RG, DRG, and RSG of all the gate elements.

The MOS transistors formed by the respective dummy gates DG1, DG3, and DG5 may be connected to one another in parallel. Accordingly, a total capacitance CDG of the MOS transistors may be easily adjusted by adjusting the capacitance CDG of each MOS transistor. Accordingly, it is possible to control an amount of charge accumulated in the first and second floating diffusion regions FD1 and FD2 by adjusting the total capacitance CDG of the MOS transistors.

Although not shown, in some embodiments of the invention, e.g., the 4-shared pixel P that may be a repeated unit of the APS array may include a dummy gate group including two dummy gates DG1 and DG3 that may be aligned with the reading gates RG, DRG, and RSG of the plurality of reading elements. That is, the four-shared pixel may include the two dummy gates DG1 and DG3 that may be aligned with any two of the reset gate RG, the drive gate, DRG and the selection gate RSG, e.g., the reset gate RG and the drive gate DRG or the reset gate RG and the selection gate RSG or the drive gate DRG and the selection gate RSG.

Figure 9:
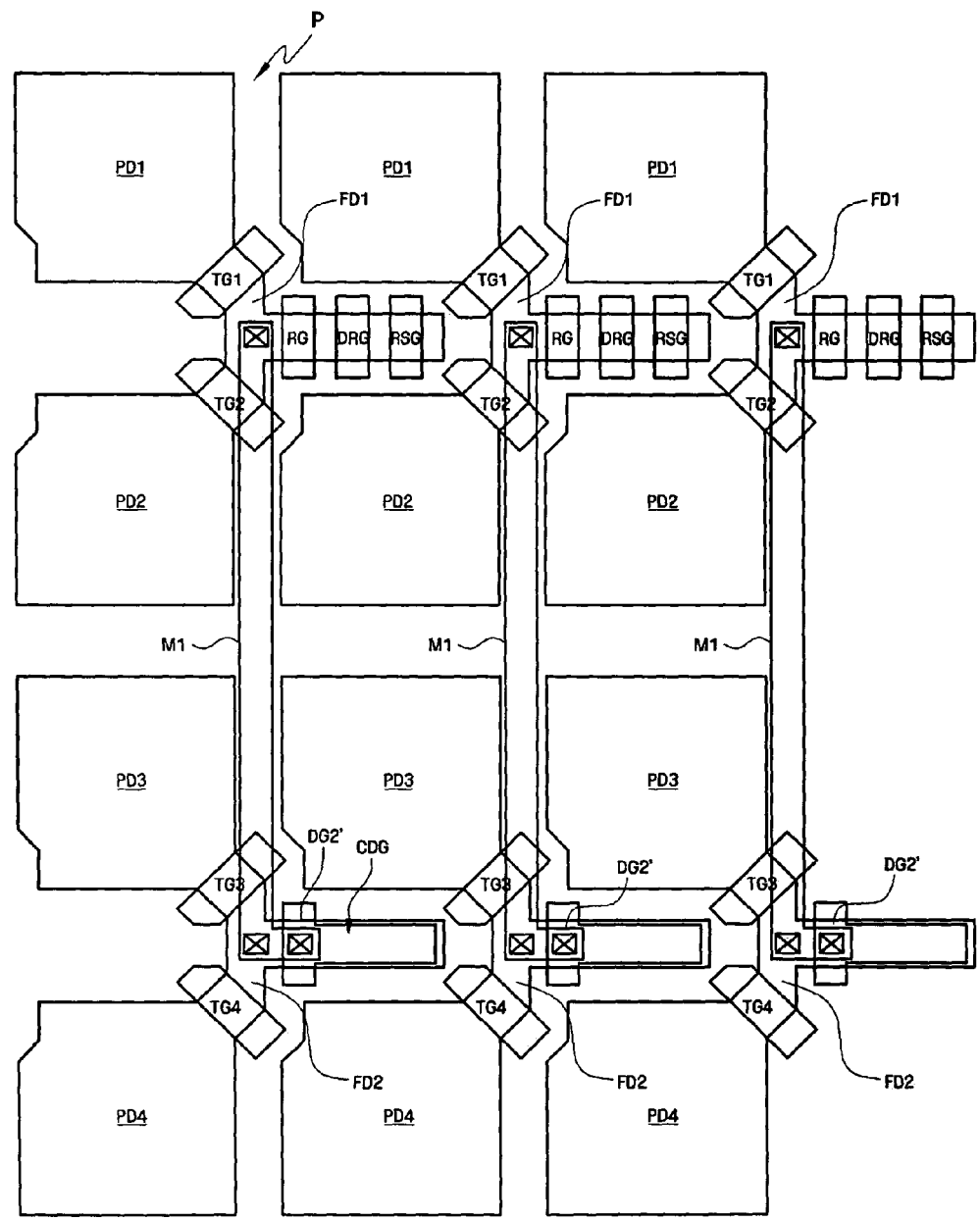
FIG. 9 illustrates a layout diagram of a fifth exemplary embodiment of an APS array of an image sensor employing one or more aspects of the present invention.

FIG. 9 illustrates a layout diagram of a fifth exemplary embodiment of an APS array of an image sensor employing one or more aspects of the present invention. Referring to FIG. 9, in the 4-shared pixel P that may be a repeating unit of the APS array according to the fifth exemplary embodiment of the invention, a dummy gate DG2' corresponding to an upper electrode of the MOS capacitor may extend to cover an entire and/or substantially an entire axis active b of the second active A2.

That is, the MOS capacitor may include a first electrode that may correspond a substrate region on a side adjacent to the second floating diffusion region FD2, and a second electrode that may correspond to the gate insulating film laminated on the first electrode, and the dummy gate DG2' that may be disposed on the gate insulating film and extending to cover the entire axis active b of the second active A2.

If the dummy gate DG2' of the MOS capacitor extends to cover the entire axis active b of the second active A2, a capacitance may be proportional to areas of the upper and lower electrodes, and the capacitance CDG of the MOS capacitor may be increased.

Accordingly, the total capacitance Ctotal of the first and second floating diffusion regions FD1 and FD2 may be further increased, which may result in an increase in a total amount of a charge stored in the first and second floating diffusion regions FD1 and FD2.

Figure 10:
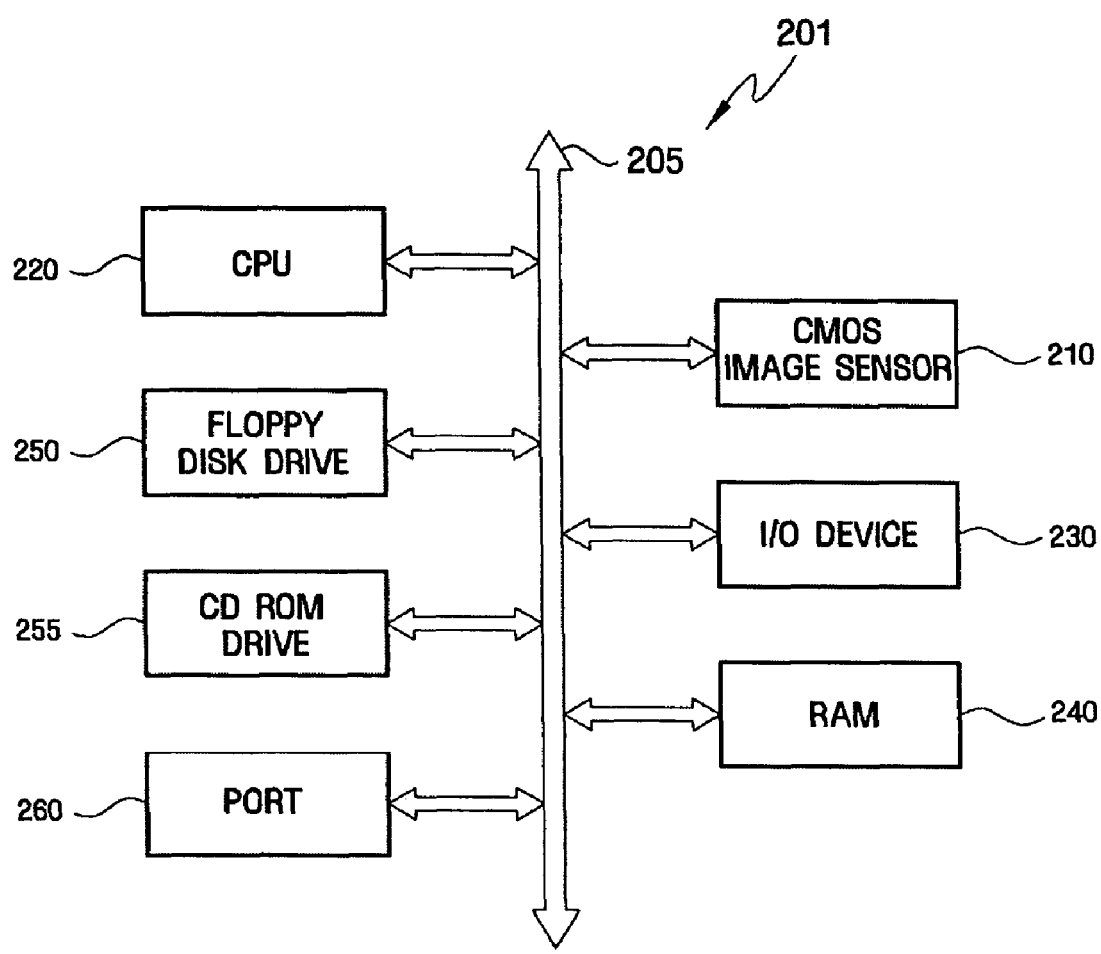
FIG. 10 illustrates a block diagram of a processor-based system including a CMOS image sensor employing one or more aspects of the present invention.

FIG. 10 illustrates a block diagram of a processor-based system including a CMOS image sensor employing one or more aspects of the present invention.

Referring to FIG. 10, a processor-based system 201 may process an output image of a CMOS image sensor 210. Examples of the processor-based system 201 may include a computer system, a camera system, a scanner, a mechanized clock system, a navigation system, a video phone, a supervising system, an automatic focus system, a tracking system, an operation monitoring system, an image stabilization system, or the like. However, embodiments of the invention are not limited to such systems.

The processor-based system 201 may include a central processing unit (CPU) 220, such as a micro processor or the like, which may communicate with an input/out (I/O) element 230 through a bus 205. A CMOS image sensor 210 may communicate with the system through the bus 205 or another communication link. The processor-based system 201 may further include a RAM 240, a floppy disk drive 250 and/or a CD ROM drive 255, and ports 260, which may communicate with the CPU 220 through the buses 205. The ports 260 may couple a video card, a sound card, a memory card, an USB element, or the like, and may perform data communication with another system. The CMOS image sensor 210 may be integrated with the CPU, a digital signal processing device DSP or a microprocessor. A memory may be further integrated. The CMOS image sensor may be integrated with a separated chip from the processor.

Embodiments of shared-pixel-type image sensors employing one or more aspects of the invention enable a total amount of a charge that can be stored in the floating diffusion region to be controlled.

Embodiments of shared-pixel-type image sensors employing one or more aspects of the invention enable a fill factor to be effectively increased by increasing the area of the photoelectric conversion element to the maximum and adopting a layout capable of using most of the increased area as the light receiving region.

Although the present invention has been described in connection with the exemplary embodiments of the present invention, it will be apparent to those skilled in the art that various modifications and changes may be made thereto without departing from the scope and spirit of the present invention. Therefore, it should be understood that the above embodiments are not limitative, but illustrative in all aspects.

What is claimed is:

1. A shared-pixel-type image sensor, comprising:
    a semiconductor substrate including first and second one-axis-merged dual lobe actives, and first and second independent reading element actives allocated to the first and second one-axis-merged dual lobe actives, respectively;
    a plurality of transmission gates between dual lobe actives of the first and second one-axis-merged dual lobe actives and connection actives, respectively;
    a first reading gate on an axis active of the first one-axis-merged dual lobe active;
    a first terminal of a MOS capacitor on an axis active of the second one-axis-merged dual lobe active;
    second and third reading gates on the first and second independent reading element actives; and
    metallic wiring lines electrically coupling the first and second one-axis-merged dual lobe actives and the MOS capacitor.

2. The shared-pixel-type image sensor as claimed in claim 1, further comprising a drive element that is formed on the semiconductor substrate, wherein the drive element is electrically coupled with the metallic wiring lines.

3. The shared-pixel-type image sensor as claimed in claim 2, wherein a second terminal of the MOS capacitor corresponds to a portion of the axis active of the second one-axis-merged dual lobe active and an insulating film exists between the first terminal and the second terminal of the MOS capacitor, and the drive element has a drive gate insulating film and a drive gate, and the drive gate insulating film and the drive gate are on a same level as the gate insulating film and the first terminal of the MOS capacitor, respectively.

4. A shared-pixel-type image sensor, comprising:
    a semiconductor substrate that has first and second one-axis-merged dual lobe actives, and first and second independent reading element actives allocated to the first and second one-axis-merged dual lobe actives, respectively;
    a plurality of transmission gates between dual lobe actives of the first and second one-axis-merged dual lobe actives and connection actives, respectively;
    a first reading gate on an axis active of the first one-axis-merged dual lobe active;
    a dummy gate on an axis active of the second one-axis-merged dual lobe active; and
    second and third reading gates on the first and second independent reading element actives.

5. The shared-pixel-type image sensor as claimed in claim 4, wherein the first reading gate is a reset gate.

6. The shared-pixel-type image sensor as claimed in claim 4, wherein the second and third reading gates are a selection gate and a drive gate, respectively.

7. The shared-pixel-type image sensor as claimed in claim 4, wherein the connection actives of the first and second one-axis-merged dual lobe actives are two-dimensionally separated and electrically coupled.

8. The shared-pixel-type image sensor as claimed in claim 7, wherein the connection actives of the first and second one-axis-merged dual lobe actives and the dummy gate are electrically coupled with each other by an interconnection layer.

9. The shared-pixel-type image sensor as claimed in claim 8, wherein the second reading gate formed on the first independent reading element active is electrically coupled with the interconnection layer.

10. The shared-pixel-type image sensor as claimed in claim 4, wherein the dual lobe actives of the first and second one-axis-merged dual lobe actives are formed so as to be adjacent to each other in one direction.

11. The shared-pixel-type image sensor as claimed in claim 4, wherein the dummy gate is substantially aligned with the first reading gate.

12. The shared-pixel-type image sensor as claimed in claim 4, wherein the dummy gate extends to cover substantially an entire surface of the axis active of the second one-axis-merged dual lobe active.

* * * * *